United States Patent
Cho et al.

(10) Patent No.: US 7,776,644 B2
(45) Date of Patent: Aug. 17, 2010

(54) PHASE CHANGE MEMORY CELL AND METHOD AND SYSTEM FOR FORMING THE SAME

(75) Inventors: Hong Cho, Suwon-Si (KR); Seung-Pil Chung, Seoul (KR); Young-Jae Kim, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 337 days.

(21) Appl. No.: 11/595,727

(22) Filed: Nov. 10, 2006

(65) Prior Publication Data

US 2008/0026586 A1 Jan. 31, 2008

(30) Foreign Application Priority Data

Jul. 31, 2006 (KR) .................. 10-2006-0072195

(51) Int. Cl.
*H01L 21/00* (2006.01)
(52) U.S. Cl. .................. 438/84; 438/95; 438/694; 438/695; 438/696; 438/738; 438/742
(58) Field of Classification Search .............. 438/84, 438/95, 694–696, 738, 742
See application file for complete search history.

(56) References Cited

U.S. PATENT DOCUMENTS

| | | | |
|---|---|---|---|
| 6,236,059 B1 * | 5/2001 | Wolstenholme et al. ........ 257/3 |
| 6,730,547 B2 | 5/2004 | Li et al. ...................... 438/128 |
| 7,037,749 B2 | 5/2006 | Horii et al. ..................... 438/95 |
| 2004/0037179 A1 * | 2/2004 | Lee ........................... 369/47.1 |
| 2005/0009358 A1 * | 1/2005 | Choi et al. .................. 438/706 |
| 2006/0021702 A1 * | 2/2006 | Kumar et al. ........... 156/345.32 |
| 2006/0057785 A1 * | 3/2006 | Satonaka et al. ............ 438/149 |
| 2007/0158632 A1 * | 7/2007 | Ho ................................. 257/4 |
| 2009/0130855 A1 * | 5/2009 | Fu et al. ..................... 438/710 |

OTHER PUBLICATIONS

Korean Patent Application No. 10-1998-21084 having Publication date of Jan. 25, 1999 (w/ English Abstract page).
Korean Patent Application No. 1020040024741 having Publication date of Oct. 13, 2005 (w/ English Abstract page).
Korean Patent Application No. 1020040052563 having Publication date of Jan. 17, 2005 (w/ English Abstract page).
Korean Patent Application No. 1020040090920 having Publication date of May 12, 2006 (w/ English Abstract page).
U.S. Patent Application No. US 2005/0032374 to Spandre, having Publication date of Feb. 10, 2005.

(Continued)

*Primary Examiner*—Kevin M Picardat
*Assistant Examiner*—Bac H Au
(74) *Attorney, Agent, or Firm*—Monica H. Choi

(57) ABSTRACT

For fabricating a phase change memory cell, a layer of phase change material and a layer of a first electrode material are deposited. In addition, the first electrode material is patterned using an etchant including a low-reactivity halogen element such as bromine or iodine to form a first electrode. By using the low-reactivity halogen element, change to the composition of the phase change material and formation of undercut and deleterious halogen by-product are avoided.

5 Claims, 10 Drawing Sheets

OTHER PUBLICATIONS

U.S. Patent Application No. US 2005/0040136 to Lee et al., having Publication date of Feb. 24, 2005.

U.S. Patent Application No. US 2005/0227035 to Fuchioka et al., having Publication date of Oct. 13, 2005.

Korean Patent Application No. 1020030017694 to Horii et al., having Publication date of Oct. 1, 2004 (w/ English Abstract page).

Korean Patent Application No. 1020030092057 to Lee, having Publication date of Jun. 22, 2005 (w/ English Abstract page).

* cited by examiner

PHASE CHANGE MEMORY CELL AND METHOD AND SYSTEM FOR FORMING THE SAME

CROSS-REFERENCE TO RELATED APPLICATION(S)

The present application claims priority under 35 U.S.C. §119 to Korean Patent Application No. 2006-72195, filed on Jul. 31, 2006, which is incorporated herein by reference in its entirety.

TECHNICAL FIELD

The present invention relates generally to phase change memory devices, and more particularly, to patterning an electrode material using an etchant including a low-reactivity halogen element for preserving the integrity of the phase change material in a phase change memory cell.

BACKGROUND OF THE INVENTION

FIG. 1 shows a circuit diagram of a phase change memory cell 100 including a variable resistor 102 and a field effect transistor M1, as known in the prior art. The variable resistor 102 has one terminal coupled to a bit-line of a phase change memory device. The variable resistor 102 has another terminal coupled to a drain of the field effect transistor M1. The gate of the field effect transistor M1 is coupled to a word-line of the phase change memory device. The source of the field effect transistor M1 is coupled to a ground node.

FIG. 2 shows an isometric view of the structure for the variable resistor 102 formed with a phase change material 104. The variable resistor 102 includes a bottom electrode 106 formed below the phase change material 104, and includes a top electrode 108 formed above the phase change material 104.

The phase change material 104 is comprised of a chalcogenide material such as Ge—Sb—Te (GST) or Ge—Bi—Te (GBT) for example. Generally, a chalcogenide alloy contains at least one element from column V or VI of the Periodic Table of the Elements. The bottom electrode 106 is comprised of a high resistivity material such as TiAlN or TiN for example. The top electrode is comprised of a conductive material such as W, Ti, TiN, Ta, or TaN for example.

The resistance of the variable resistor 102 is determined by a structural phase of a programmable volume 110 of the phase change material 104. The programmable volume 110 is set to one of an amorphous phase or a crystalline phase from heating by a current flowing through the variable resistor 102. Such current flows through the bottom electrode 106, the phase change material 104, and the top electrode 108 of the variable resistor 102 for heating the programmable volume 110.

FIG. 3 shows a first temperature characteristic 112 (shown in dashed lines in FIG. 3) of the programmable volume 110 that is set to the amorphous phase for higher resistance. In that case, the programmable volume 110 is heated from time point t1 to time point t2 for attaining a temperature (such as 620° Celsius) higher than a melting temperature (Tm=610° Celsius) of the phase change material 104.

Subsequently, the programmable volume 110 is cooled relatively quickly back to room temperature from time point t2 to time point t3. FIG. 4 shows a first current characteristic 114 resulting in the first temperature characteristic 112 of FIG. 3. In that case, a relatively high level of current (such as 1.2 milli-Amps) flows through the variable resistor 102 from time point t1 to time point t2 (such as a duration in a range of 4 to 5 nano-seconds).

FIG. 3 also shows a second temperature characteristic 116 of the programmable volume 110 that is set to the crystalline phase for lower resistance. In that case, the programmable volume 110 is heated from time point t1 to time point t4 for attaining a temperature (such as 460° Celsius) that is slightly higher than a crystallization temperature (Tc=450° Celsius) of the phase change material 104.

Subsequently, the programmable volume 110 is cooled back to room temperature from time point t4 to time point t5. FIG. 4 shows a second current characteristic 118 resulting in the second temperature characteristic 116 of FIG. 3. In that case, a lower level of current (such as 0.56 milli-Amps) flows through the variable resistor 102 from time point t1 to time point t4 (such as a duration of about 500 nano-seconds).

The amorphous phase or the crystalline phase of the programmable volume 110 represents the binary states of the phase change memory cell 100.

FIGS. 5A, 5B, and 5C illustrate cross-sectional views during fabrication of the variable resistor 102 on a semiconductor substrate 120 according to the prior art. Referring to FIG. 5A, the bottom electrode 106 is formed as a plug on an inter-level material 124 which may be an insulator material. Spacers 126 surround the plug 106, and an insulating layer 128 surrounds the spacers 126. A phase change material 130 is deposited onto the plug 106, and a top electrode material 132 is deposited on the phase change material 130. In addition, a hard-mask 134 is patterned over the top electrode material 132.

Referring to FIG. 5B, exposed regions of the top electrode material 132 are etched away to form the top electrode 108. Referring to FIG. 5C, exposed regions of the phase change material 130 are etched away to form the phase change material structure 104 of FIG. 2.

In the prior art, such as disclosed in U.S. Patent Application Publication No. 2005/0227035 to Fuchioka et al., an etchant including a highly reactive halogen element such as chlorine and/or fluorine is used for etching the top electrode material 132 to form the top electrode 108. However, referring to FIG. 6, such a highly reactive halogen element also etches away the phase change material 130 to result in undercuts 140 into the phase change material 130.

In addition, halogen by-products 142 comprised of $TiCl_2$, $TiCl_3$, and/or $TiCl_4$ are formed during such etching of the top electrode material 132. These halogen by-products 142 are difficult to remove by ashing and strip processes. Such remaining halogen by-products 142 may later diffuse into semiconductor structures during subsequent heating processes. Such diffusion may degrade integrated circuit performance, and such diffusion imposes a heat budget for minimizing such diffusion during subsequent heating processes.

Furthermore, the highly reactive halogen element used for etching the top electrode material 132 may react with the phase change material 130 alter the composition of the remaining phase change material structure 104.

Thus, a phase change memory device is desired to be fabricated without such disadvantageous features of the prior art.

SUMMARY OF THE INVENTION

Accordingly, in a general aspect of the present invention, an etchant including a low reactivity halogen element is used to etch the top electrode material for forming a phase change memory cell with high integrity.

For fabricating a phase change memory cell according to an aspect of the present invention, a layer of phase change material and a layer of a first electrode material are deposited. In addition, the first electrode material is patterned using an etchant including a low-reactivity halogen element to form a first electrode. In an example embodiment of the present invention, the low-reactivity halogen element is one of bromine and iodine.

In another example embodiment of the present invention, at least a portion of the phase change material is etched using the low-reactivity halogen element to form at least a portion of a phase change structure. In that case, a passivation material is formed at exposed sidewalls of the first electrode and the phase change structure. For example, the passivation material is comprised of one of $TiBr_3$, $TiBr_4$, $TiI_3$, and $TiI_4$.

In a further embodiment of the present invention, the phase change material is patterned to form a phase change structure. In an example embodiment of the present invention, the phase change material is etched in-situ in a dry etch system using a same etch recipe as for patterning the first electrode material. In another embodiment of the present invention, the phase change material is etched using a different etch recipe as for patterning the top electrode material.

For further fabricating the phase change memory cell, a second electrode is formed with the phase change structure being disposed between the first and second electrodes.

A phase change memory cell according to another general aspect of the present invention includes a first electrode, a phase change structure, and a passivation material formed at sidewalls of the first electrode and the phase change structure. The passivation material is comprised of a low-reactivity halogen element.

In this manner, by using the low-reactivity halogen element such as bromine in HBr or iodine in HI during etching of the top electrode material, undercutting into the phase change material is prevented. In addition, the composition of the phase change material is not significantly altered after such etching of the top electrode material. Furthermore, the low-reactivity halogen by-product may be more easily removed and has relatively low reactivity such that a heat budget may not be required during subsequent heating process steps.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5A, 5B, 5C, 6, 7, 8, 9, 10A, 10B, 11, 12, 13, 14, 15, 16, 17, 18, 19, and 20 refer to elements having similar structure and/or function.

DETAILED DESCRIPTION

Figure 16:
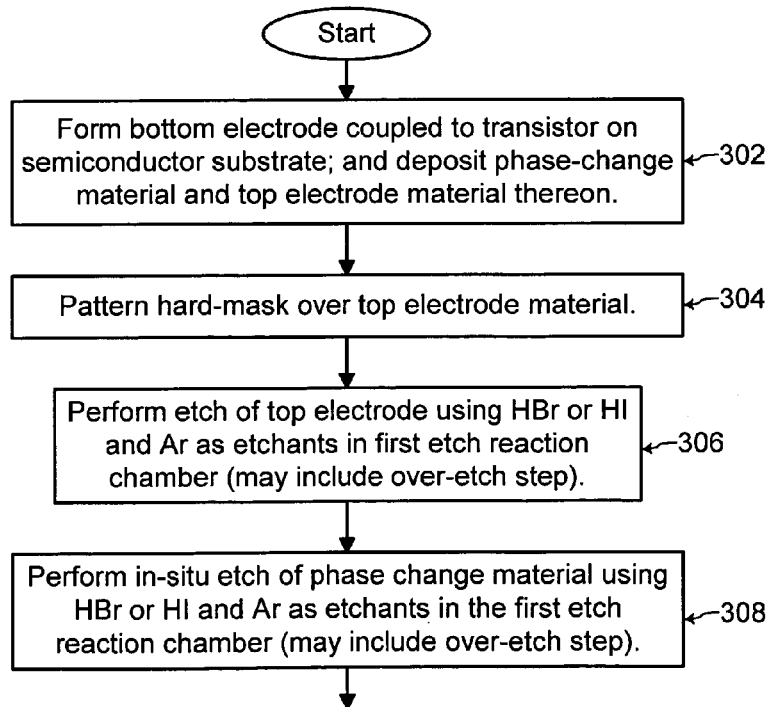
FIG. 16 shows a flow-chart of steps for forming the phase change memory cell of FIG. 11 in the system of FIG. 15, according to an embodiment of the present invention.
Figure 18:
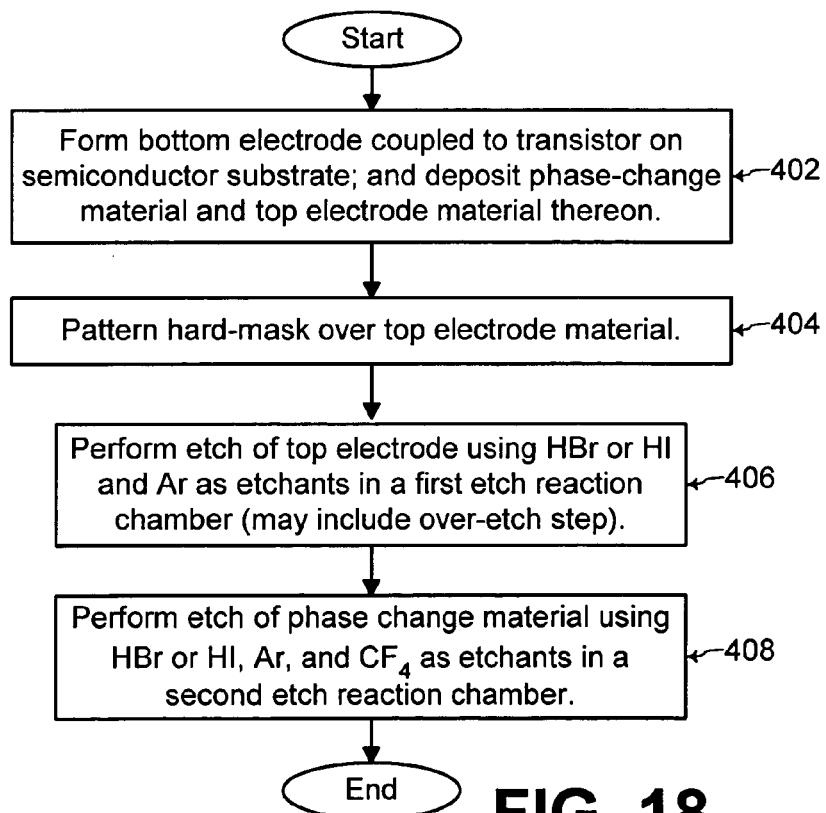
FIG. 18 shows a flow-chart of steps for forming the phase change memory cell of FIG. 12 in the system of FIGS. 15 and 17, according to an embodiment of the present invention.
Figure 20:
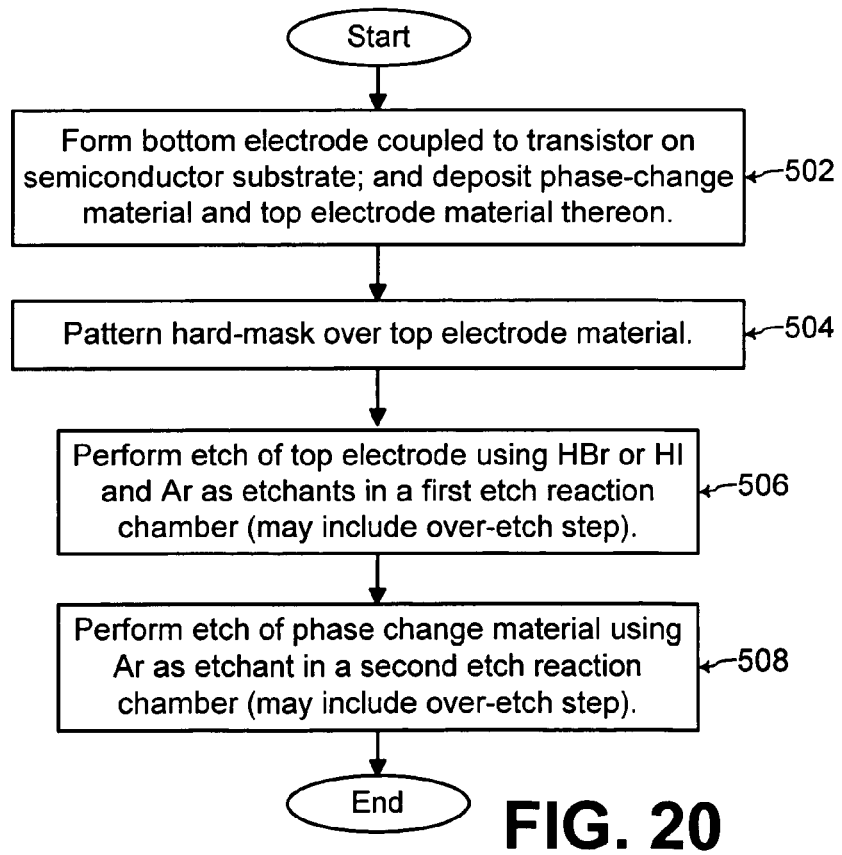
FIG. 20 shows a flow-chart of steps for forming the phase change memory cell of FIGS. 13 and 14 in the system of FIGS. 15 and 19, according to another embodiment of the present invention.

FIGS. 7, 8, 9, 11, 12, 13, and 14 show cross-sectional views during fabrication of phase change memory cells according to embodiments of the present invention. FIGS. 16, 18, and 20 show flow-charts of steps during fabrication of phase change memory cells according to embodiments of the present invention.

Figure 7:
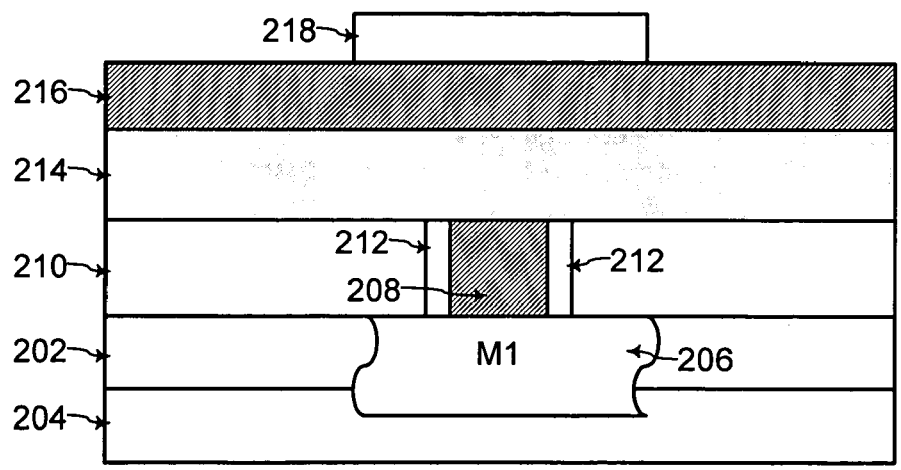
FIGS. 7, 8, and 9 show cross-sectional views during etching of a top electrode material using an etchant including a low-reactivity halogen element, for forming a phase change memory cell according to an embodiment of the present invention.

Referring to FIG. 7, at least one inter-level material 202 is deposited on a semiconductor substrate 204. In one example embodiment of the present invention, a transistor M1 such as the field effect transistor M1 of FIG. 1 for example associated with the phase change memory cell is formed with the semiconductor substrate 204 and the at least one inter-level material 202. The semiconductor substrate 204 is a silicon wafer in one example embodiment of the present invention.

Further referring to FIG. 7, a bottom electrode 208 is formed as a plug in a layer of insulating material 210 formed on the at least one inter-level material 202 (steps 302, 402, and 502 of FIGS. 16, 18, and 20). The bottom electrode 208 is coupled to the transistor M1 in an embodiment of the present invention. A spacer 212 comprised of an insulating material is formed to surround the bottom electrode plug 208.

Additionally referring to FIG. 7, a layer of phase change material 214 is deposited onto the bottom electrode plug 208 and the insulating material 210 (steps 302, 402, and 502 of FIGS. 16, 18, and 20). A layer of top electrode material 216 is deposited onto the phase change material 214 (steps 302, 402, and 502 of FIGS. 16, 18, and 20). A hard mask 218 is patterned on the layer of top electrode material 216 (steps 304, 404, and 504 of FIGS. 16, 18, and 20).

The bottom electrode 208 is comprised of a high resistivity material and may be comprised of one of TiN, TiAlN, TiBN, TiSiN, TaN, TaAlN, TaBN, TaSiN, WN, WBN, WSiN, WAlN, ZrN, ZrSiN, ZrAlN, ZrBN, MoN, Al, Al—Cu, Al—Cu—Si, WSi$_x$, Ti, W, Mo, Ta, and TiW, in an example embodiment of the present invention. The top electrode material 216 is a conductive material and may be comprised of one of TiN, TiAlN, TiBN, TiSiN, TaN, TaAlN, TaBN, TaSiN, WN, WBN, WSiN, WAlN, ZrN, ZrSiN, ZrAlN, ZrBN, MoN, Al, Al—Cu, Al—Cu—Si, WSi$_x$, Ti, W, Mo, Ta, and TiW, in an example embodiment of the present invention.

The phase change material 214 is a chalcogenide material containing at least one element from column V or VI of the Periodic Table of the Elements. The phase change material 214 is one of Ge—Sb—Te, Ge—Bi—Te, As—Sb—Te, As—Ge—Sb—Te, Sn—Sb—Te, Sn—Sb—Te, In—Sn—Sb—Te, Ag—In—Sb—Te, GroupVA-Sb—Te, GroupVIA-Sb—Te, GroupVA-Sb—Se, GroupVIA-Sb—Se, Ge—Sb—Te—Si, As—Sb—Te—Si, As—Ge—Sb—Te—Si, Sn—Sb—Te—Si, In—Sn—Sb—Te—Si, Ag—In—Sb—Te—Si, GroupVA-Sb—Te—Si, GroupVIA-Sb—Te—Si, GroupVA-Sb—Se—Si, and GroupVIA-Sb—Se—Si, in an example embodiment of the present invention.

Figure 8:
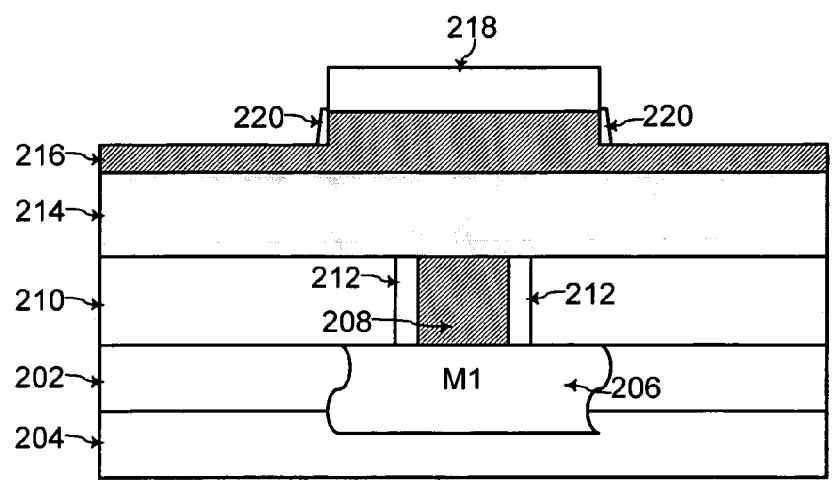
Figure 15:
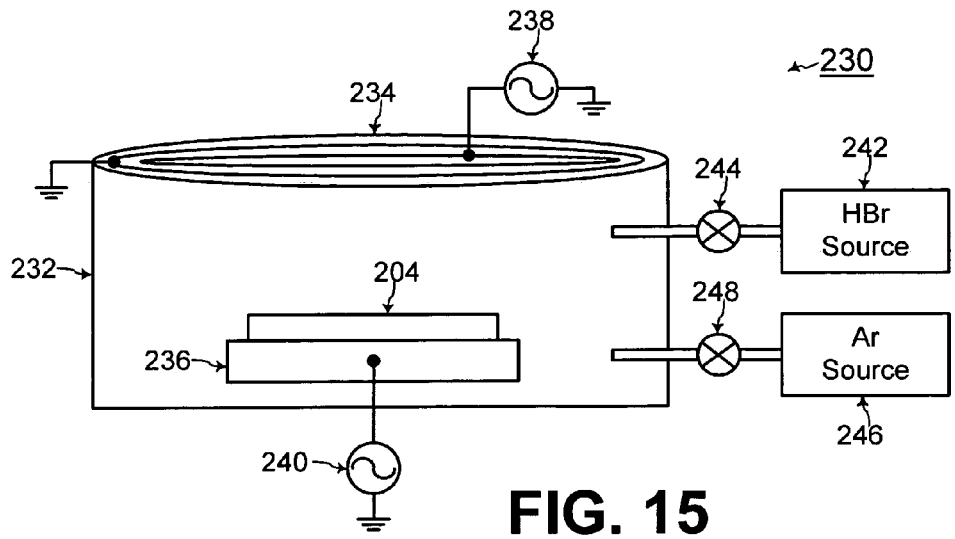
FIG. 15 shows a system including a first dry etch reaction chamber for etching the top electrode material, according to an embodiment of the present invention.

Referring to FIGS. 7 and 8, exposed regions of the top electrode material 216 are etched away using an etchant including a low-reactivity halogen element (steps 306, 406, and 506 of FIGS. 16, 18, and 20). FIG. 15 illustrates a system 230 for fabricating a phase change memory cell according to an embodiment of the present invention. The system 230 includes a first dry etch reaction chamber 232 that is part of an ICP (inductively coupled plasma) dry etch system in one embodiment of the present invention.

Such a dry etch system includes a coil 234 disposed at one end of the first reaction chamber 232 for generating plasma and includes a wafer chuck 236 disposed at the other end of the first reaction chamber 232 for holding the semiconductor substrate 204 having the structures of FIG. 7 formed thereon. A plasma source 238 generates source power applied on the coil 234, and a bias source 240 generates bias power applied on the wafer chuck 236.

A HBr (hydrogen bromide) source 242 provides HBr gas as an etchant into the first reaction chamber 232 via a first valve 244 that controls the flow rate of HBr gas into the first reaction chamber 232. In addition, an Ar (argon) source 246 provides Ar gas as another etchant into the first reaction chamber 232 via a second valve 248 that controls the flow rate of Ar gas into the first reaction chamber 232.

Referring to FIGS. 8 and 15, a first etch step is performed for etching away exposed regions of the top electrode material 216 (steps 306, 406, and 506 of FIGS. 16, 18, and 20) according to a following first etch recipe:

flowing HBr gas into the first reaction chamber 232 at a flow rate of from about 40 to about 60 sccm (standard cubic centimeters per minute);

flowing Ar gas into the first reaction chamber 232 at a flow rate of from about 40 to about 60 sccm (standard cubic centimeters per minute);

setting a pressure within the first reaction chamber 232 to be from about 3 to about 7 milli-Torr;

setting the bias power applied on the semiconductor substrate 204 via the wafer chuck 236 from the bias source 240 to be from about 150 to about 250 Watts; and setting the source power applied on the coil 234 from the plasma source 238 to be from about 400 to about 600 Watts.

With the source power applied on the coil 234 from the plasma source 238, plasma is generated within the first reaction chamber 232. With such plasma, ions are generated from the etchant HBr and AR gases. In such an embodiment of the present invention, bromine is the low reactivity element used in etching of the top electrode material 216. In another embodiment of the present invention, the HBr source 242 may be replaced with an HI (hydrogen iodide) source, and in that case, iodine would be the low reactivity element used in etching of the top electrode material 216.

Further referring to FIG. 8, a passivation material 220 is formed at the exposed sidewalls of the remaining top electrode material 216 during etching of the top electrode material 216 within the reaction chamber 232. The passivation material 220 is comprised of titanium bromide (TiBr$_3$ or TiBr$_4$) when the top electrode material 216 is comprised of titanium in an example embodiment of the present invention. The passivation material 220 would be comprised of titanium iodide (TiI$_3$ or TiI$_4$) if the HBr source 242 were replaced by a HI source.

Figure 10A:
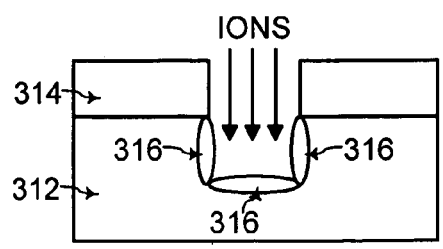
FIGS. 10A and 10B show cross-sectional views for illustrating formation of a passivation material during a dry etch process, according to an embodiment of the present invention.
Figure 10B:
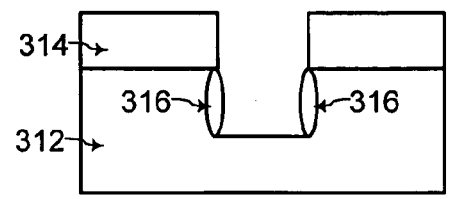

FIGS. 10A and 10B illustrate formation of the passivation material 220. Referring to FIG. 10A, an etched material 312 and etchant ions formed within the reaction chamber 232 react to form the passivation material 316. In FIGS. 10A and 10B, a masking material 314 is patterned on the etched material 312. However, because the ions are directed toward any horizontal surface, the passivation material 316 formed on such horizontal surface is turned into a gas that is dissipated away from such horizontal surface, as illustrated in FIG. 10B. Thus, the passivation material 316 remains just at the exposed sidewalls of the etched material 312. The passivation material 220 is similarly formed at the exposed sidewalls of the etched top electrode material 216 during etching within the first reaction chamber 232.

Figure 9:
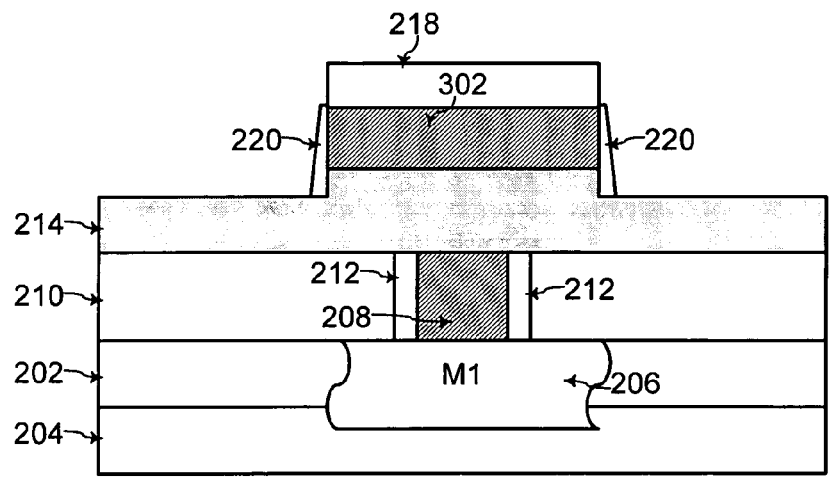

After the first etch step of FIG. 8, an over etch step is performed for completely etching away the exposed region of the first electrode material 216, as illustrated in FIG. 9, to form a first electrode 302 of the phase change memory cell (steps 306, 406, and 506 of FIGS. 16, 18, and 20). The first step of FIG. 8 and the over etch step of FIG. 9 are used when the semiconductor substrate 204 has regions of difference device densities. The etch rates in such different device density regions may be different. The over etch step ensures that the exposed regions of top electrode material 216 are completely etched away in such different device density regions. An example of a recipe for the over etch step is as follows:

flowing HBr gas into the first reaction chamber 232 at a flow rate of from about 40 to about 60 sccm (standard cubic centimeters per minute);

flowing Ar gas into the first reaction chamber 232 at a flow rate of from about 40 to about 60 sccm (standard cubic centimeters per minute);

setting a pressure within the first reaction chamber 232 to be from about 3 to about 7 milli-Torr or from about 20 to about 40 milli-Torr;

setting the bias power applied on the semiconductor substrate 204 via the wafer chuck 236 from the bias source 240 to be from about 150 to about 250 Watts; and setting the source power applied on the coil 234 from the plasma source 238 to be from about 400 to about 600 Watts.

The first etch step of FIG. 8 and the over etch step of FIG. 9 may be performed in the same reaction chamber 232 or in different reaction chambers. If a plurality of phase change memory cells are formed with uniform density across the semiconductor wafer 204, then the over etch step may be omitted for the present invention.

Figure 1:
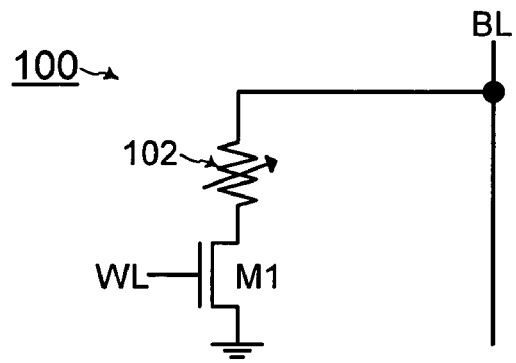
FIG. 1 shows a circuit diagram of a phase change memory cell, according to the prior art.
Figure 2:
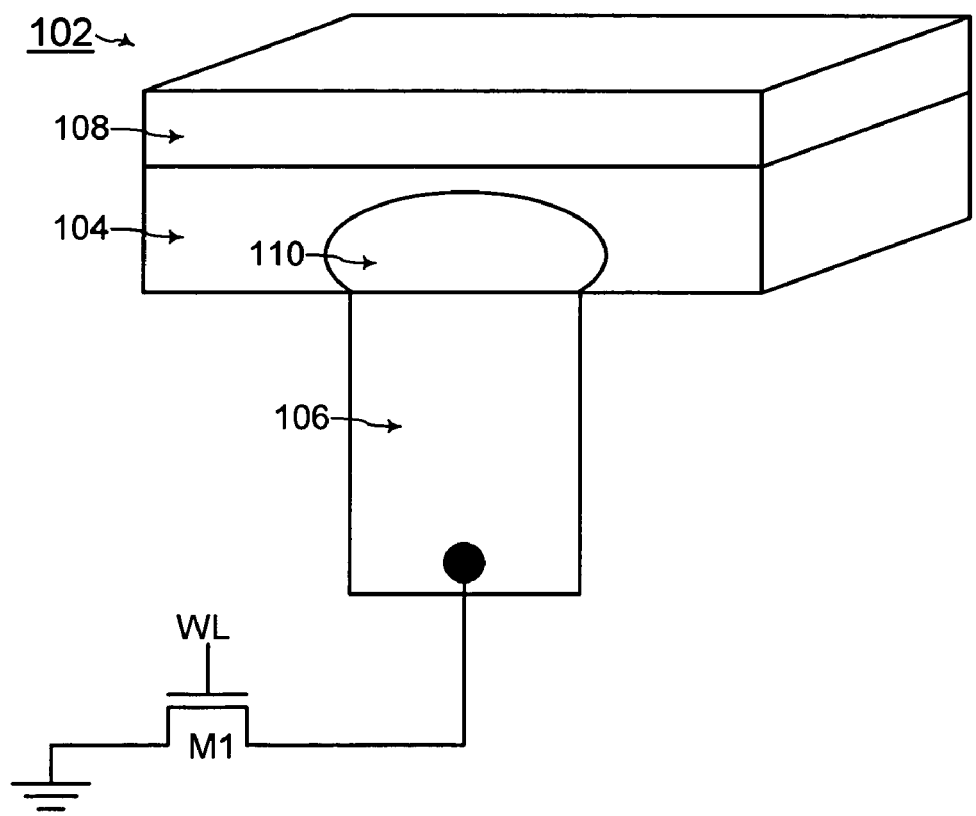
FIG. 2 shows an isometric view of a variable resistor in the phase change memory cell of FIG. 1, according to the prior art.
Figure 3:
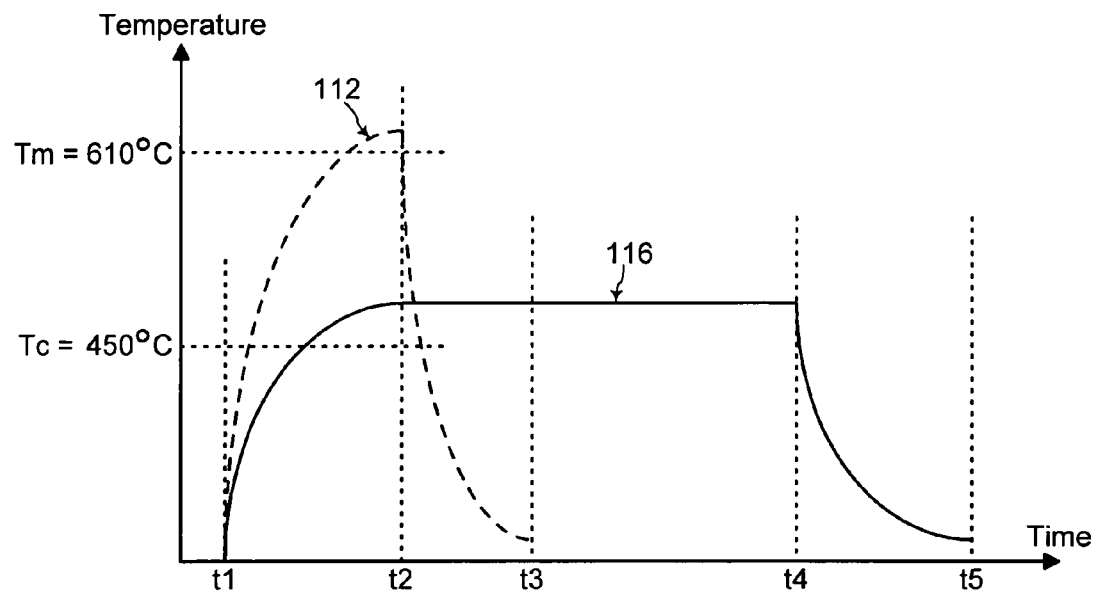
FIG. 3 shows temperature characteristics for setting a phase change material of the phase change memory cell of FIGS. 1 and 2 to be one of amorphous or crystalline, according to the prior art.
Figure 4:
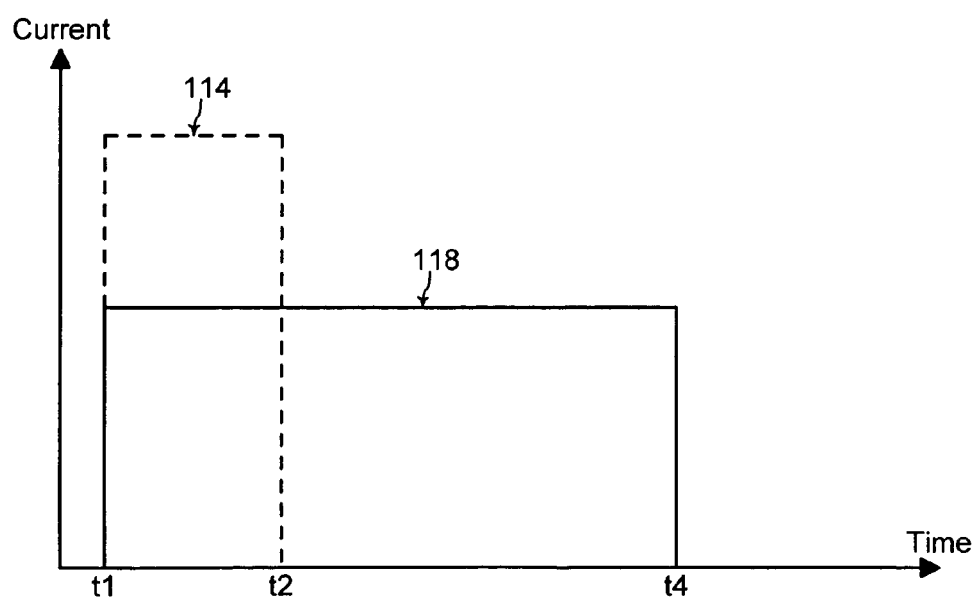
FIG. 4 shows current characteristics for setting the phase change material of the phase change memory cell of FIGS. 1 and 2 to be one of amorphous or crystalline, according to the prior art.
Figure 5A:
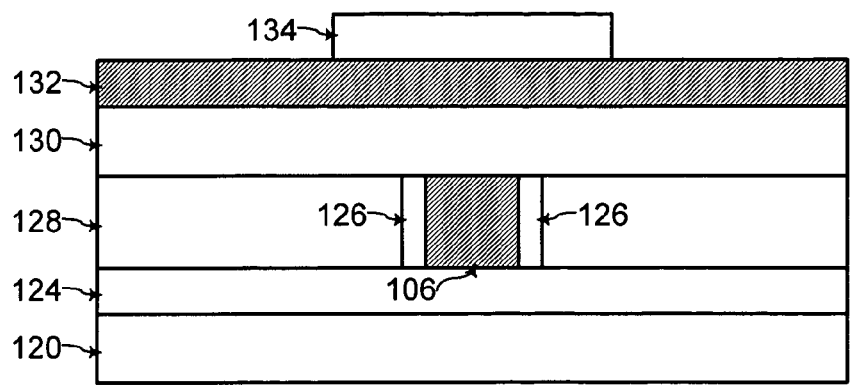
FIGS. 5A, 5B, and 5C show cross-sectional views during fabrication of the phase change memory cell of FIGS. 1 and 2, according to the prior art.
Figure 5B:
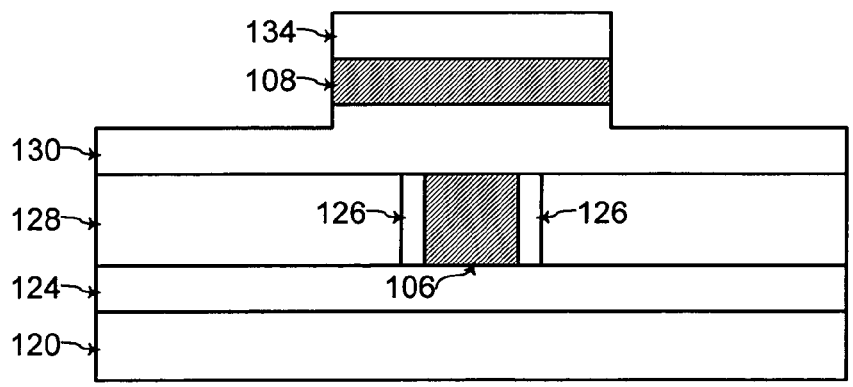
Figure 5C:
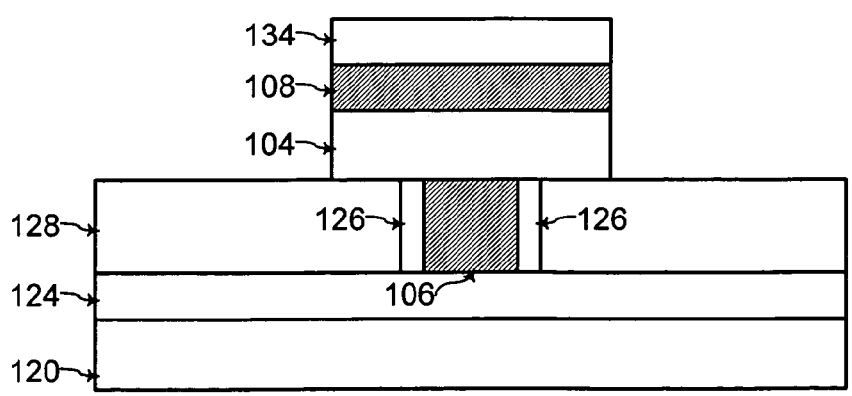
Figure 6:
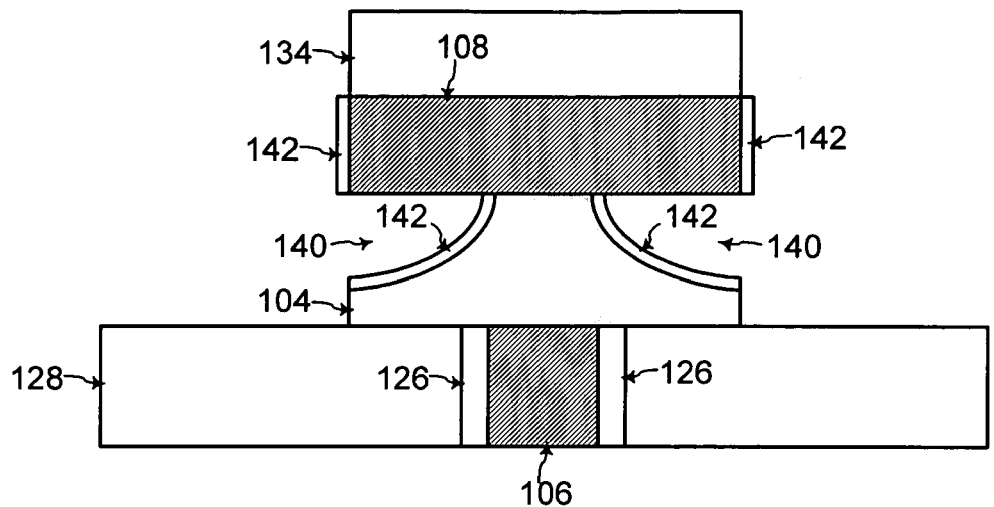
FIG. 6 illustrates under-cutting of the phase change material during etch of a top electrode material, according to the prior art.

Note that part of the phase change material 214 is also etched during the over etch step of FIG. 9. In addition, the passivation material 220 is formed at any exposed sidewalls of the top electrode 302 and the etched portion of the phase change material 214. Such passivation material 220 further protects the sidewalls of the etched portion of the phase change material 214 for preventing the formation of the under-cut 140 (as illustrated in FIG. 6) in the phase change material 214 during etching of the top electrode material 216.

Figure 11:
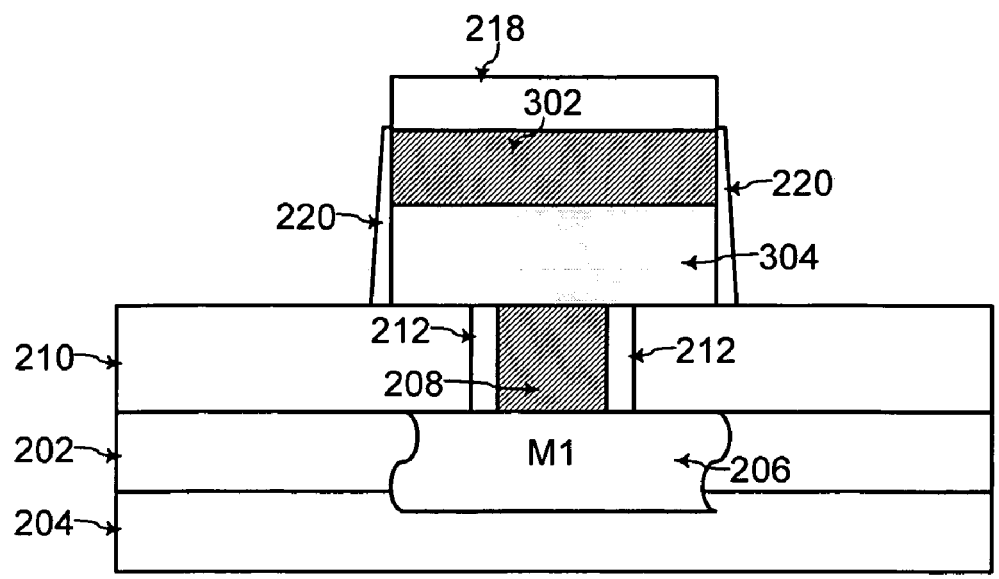
FIG. 11 shows a cross-sectional view after in-situ etching of a phase change material after etch of the top electrode material, according to an embodiment of the present invention.

Referring to FIGS. 9 and 11, after forming the first electrode 302, a further etch step is performed to etch away exposed regions of the phase change material 214 to form a phase change structure 304. In one embodiment of the present invention as illustrated in FIGS. 11 and 16, the etch step for etching away exposed regions of the phase change material 214 to form the phase change structure 304 is performed in-situ within the same first reaction chamber 232 (step 308 of FIG. 16) using the same etch recipe as was used for etching the top electrode material 216 (in step 306 of FIG. 16). Thus, the passivation material 220 may be formed also on the sidewalls of the phase change structure 304 as illustrated in FIG. 11.

In one embodiment of the present invention, the phase change memory cell is formed with the passivation material 220 remaining on the sidewalls of the top electrode 302 and the phase change structure 304. In an alternative embodiment of the present invention, passivation material 220 may be stripped away from the final phase change memory cell.

Figure 17:
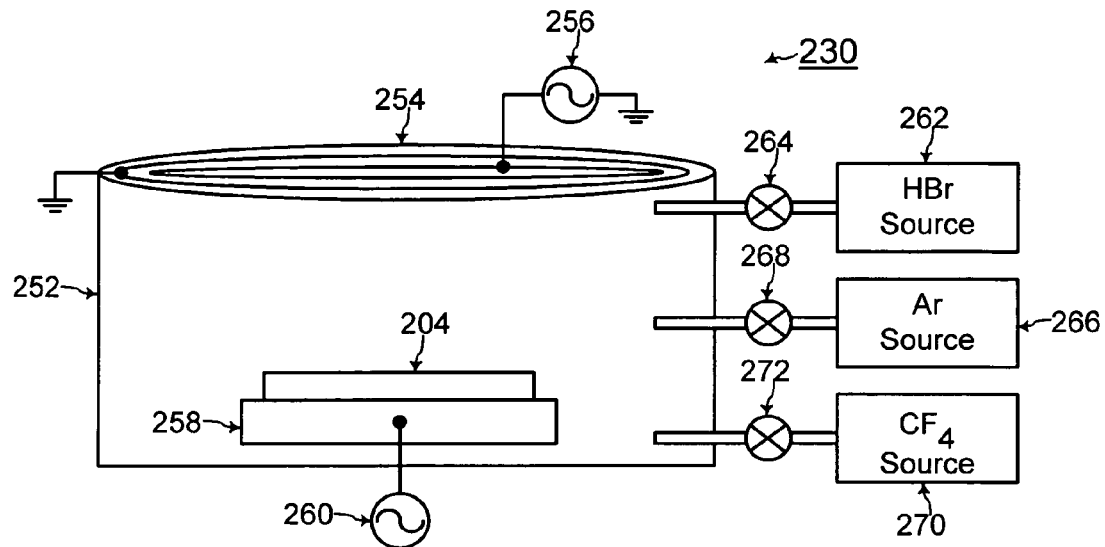
FIG. 17 shows a system including a second dry etch reaction chamber for etching the phase change material with a first set of etchants, according to an embodiment of the present invention.

In another embodiment of the present invention, the further etch step for etching away exposed regions of the phase change material 214 for forming the phase change structure 304 is performed with a second etch recipe in a second reaction chamber 252 as illustrated in FIG. 17 (step 408 of FIG. 18). Referring to FIG. 17, the system 230 for forming the phase change memory cell further includes the second reaction chamber 252 having a coil 254, a plasma source 256, a wafer chuck 258, a bias source 260, a HBr source 262, a first valve 264, a Ar source 266, and a second valve 268, similarly as for the first reaction chamber 232 of FIG. 15. Thus, the second reaction chamber 232 of FIG. 17 is also for an ICP (inductively coupled plasma) dry etch system in one embodiment of the present invention.

Figure 12:
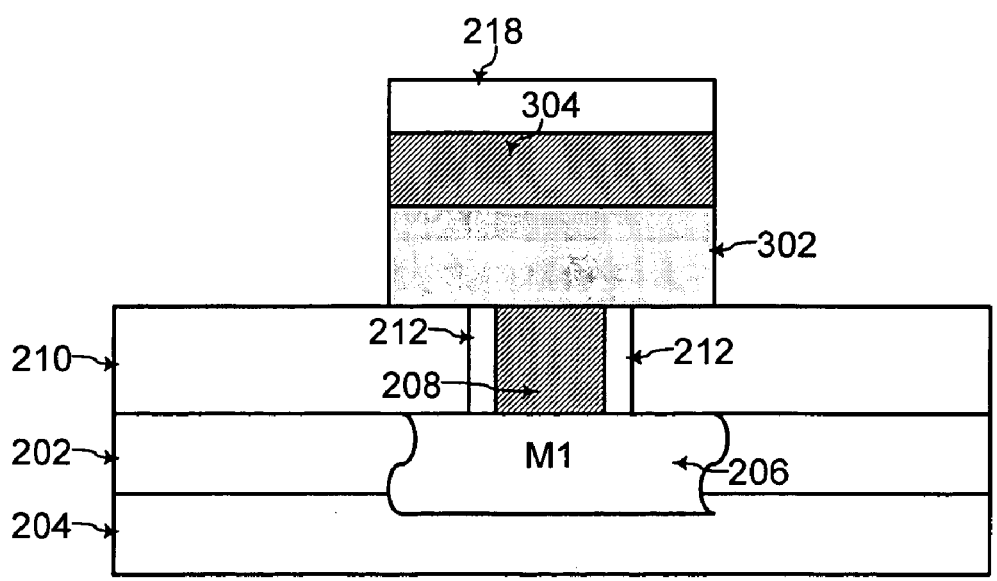
FIG. 12 shows a cross-sectional view after etching of a phase change material in a separate process after etch of the top electrode material, according to an embodiment of the present invention.

In addition, the second reaction chamber 252 also includes a $CF_4$ source 270 and a third valve 272 that determines the flow rate of $CF_4$ gas into the second reaction chamber 252. The exposed regions of the remaining phase change material 214 of FIG. 9 are etched away in the second reaction chamber 252 to form the phase change material structure 302 as illustrated in FIG. 12 according to the following recipe in one embodiment of the present invention:

flowing HBr gas from the HBr source 262 into the second reaction chamber 252 at a flow rate of from about 15 to about 35 sccm (standard cubic centimeters per minute);

flowing Ar gas from the Ar source 266 into the second reaction chamber 252 at a flow rate of from about 40 to about 60 sccm (standard cubic centimeters per minute);

flowing $CF_4$ gas from the $CF_4$ source 270 into the second reaction chamber 252 at a flow rate of from about 15 to about 35 sccm (standard cubic centimeters per minute);

setting a pressure within the second reaction chamber 252 to be from about 5 to about 20 milli-Torr;

setting the bias power from the bias source 260 applied on the semiconductor substrate 204 via the chuck 258 to be from about 150 to about 250 Watts; and setting the source power applied on the coil 254 from the plasma source 256 to be from about 400 to about 600 Watts.

The passivation material 220 is etched away from the sidewalls of the top electrode 302 and the phase change material structure 304 during such an etch process, as illustrated in FIG. 12.

Figure 19:
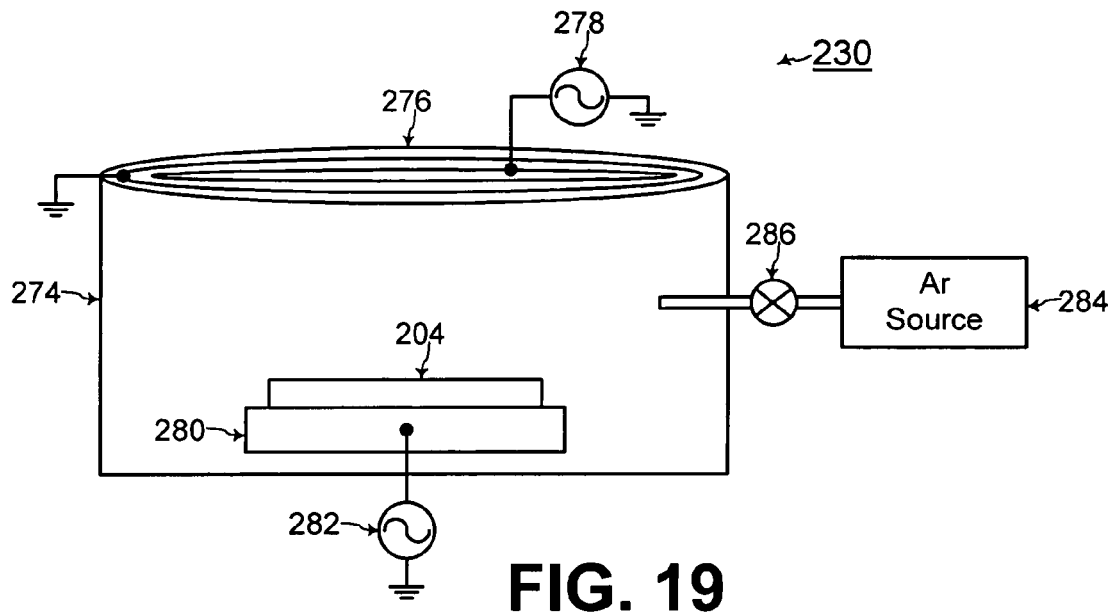
FIG. 19 shows a system including a second dry etch reaction chamber for etching the phase change material with an Argon etchant, according to another embodiment of the present invention.

In another embodiment of the present invention, just Ar is used as an etchant for etching away exposed regions of the phase change material 214 (step 508 of FIG. 20) in another reaction chamber 274 as illustrated in FIG. 19. Referring to FIG. 19, the system 230 for forming the phase change memory cell further includes the reaction chamber 274 having a coil 276, a plasma source 278, a wafer chuck 280, and a bias source 282, similarly as for the first reaction chamber 232 of FIG. 15. Thus, the reaction chamber 274 of FIG. 19 is also for an ICP (inductively coupled plasma) dry etch system in one embodiment of the present invention.

Figure 13:
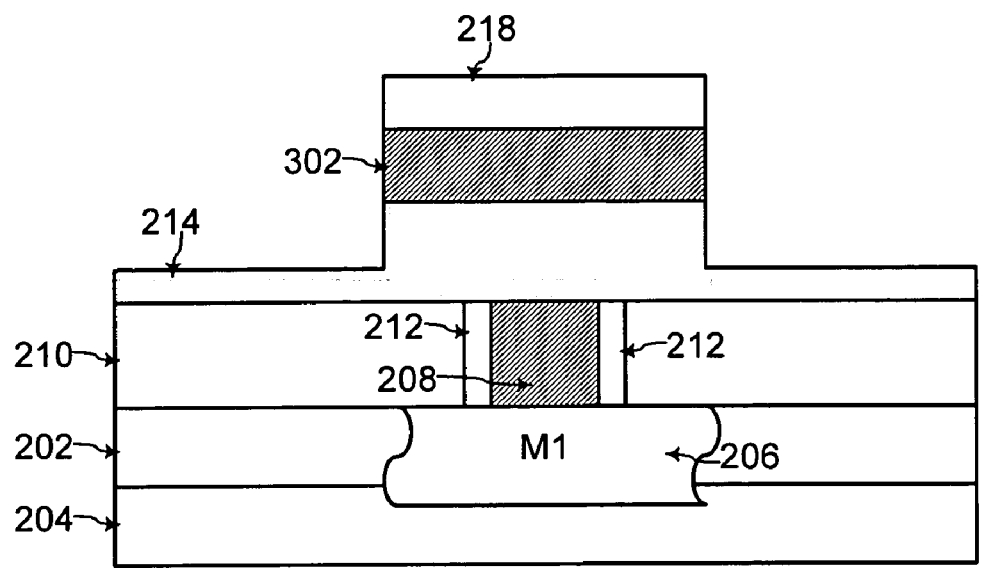
FIGS. 13 and 14 show cross-sectional views during a etching of a phase change material in two-stage processes after etch of the top electrode material, according to an embodiment of the present invention.

In addition, the reaction chamber 274 also includes an Ar source 284 and a valve 286 that determines the flow rate of Ar gas into the reaction chamber 274. The exposed regions of the remaining phase change material 214 of FIG. 9 are etched away in the reaction chamber 274 in an initial etch step as illustrated in FIG. 13 (step 508 of FIG. 20) according to the following recipe in one embodiment of the present invention:

flowing Ar gas into the reaction chamber 274 at a flow rate of from about 40 to about 60 sccm (standard cubic centimeters per minute);

setting a pressure within the reaction chamber 274 to be from about 5 to about 15 milli-Torr;

setting the bias power from the bias source 282 applied on the semiconductor substrate 204 via the chuck 280 to be from about 100 to about 180 Watts; and setting the source power applied on the coil 276 from the plasma source 278 to be from about 1250 to about 1400 Watts.

Figure 14:
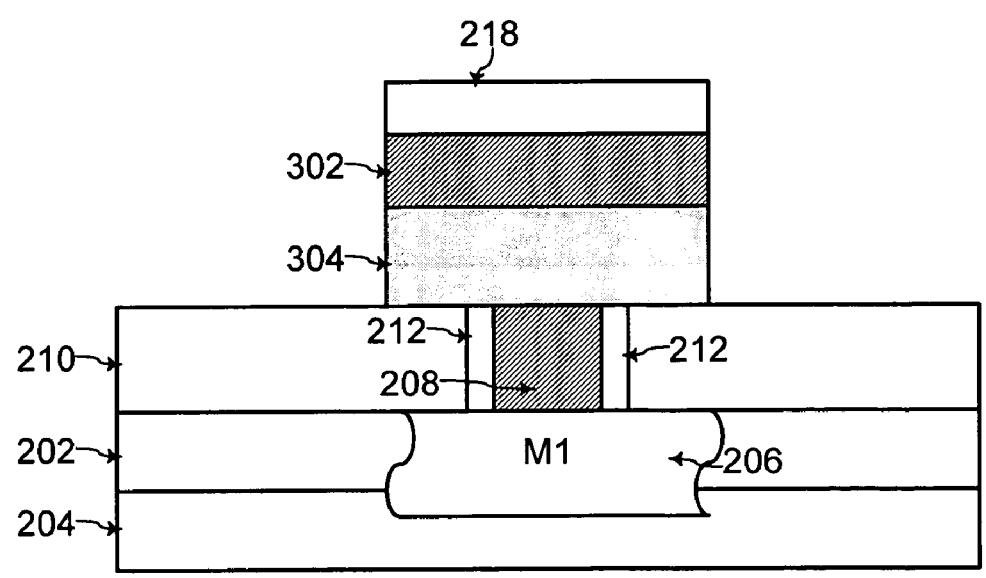

Subsequently, an over etch step is performed to completely etch away any remaining exposed portions of the phase change material 214 of FIG. 13 in an over etch step as illustrated in FIG. 14 (step 508 of FIG. 20) according to the following recipe in one embodiment of the present invention:

flowing Ar gas into the reaction chamber 274 at a flow rate of from about 40 to about 60 sccm (standard cubic centimeters per minute);

setting a pressure within the reaction chamber 274 to be from about 5 to about 15 milli-Torr;

setting the bias power from the bias source 282 applied on the semiconductor substrate 204 via the chuck 280 to be from about 150 Watts to about 250 Watts; and setting the source power applied on the coil 276 from the plasma source 278 to be from about 800 Watts to about 1000 Watts.

The over etch step ensures that the exposed regions of phase change material 214 are completely etched away in different device density regions of the semiconductor substrate 204. The first etch step of FIG. 13 and the over etch step of FIG. 14 may be performed in the same reaction chamber 274 or in different reaction chambers. If a plurality of phase change memory cells are formed with uniform density across the semiconductor wafer 204, then the over etch step may be omitted for the present invention.

In this manner, HBr or HI used as an etchant includes bromine or iodine as the low reactivity halogen element. The term "low reactivity halogen element" is used herein to refer to a halogen element such as bromine and iodine that has lower reactivity with any material used for the top electrode material 216 than chlorine or fluorine.

In the prior art, an etchant with a relatively high reactivity halogen element such as chlorine and/or fluorine is used to etch metals or metal alloys forming the top electrode material of a phase change memory cell. One of ordinary skill in the art would not consider using an etchant with a low reactivity halogen element for etching the metal or metal alloy of the top electrode material 216 because of the low through-put during fabrication of a phase change memory device. However, the present invention uses an etchant with a low reactivity halogen element for etching the metal or metal alloy of the top electrode material 216 for avoiding change to the composition of the phase change material 214 and for avoiding formation of the undercut 140 and the deleterious halogen by-product 142 of the prior art.

The foregoing is by way of example only and is not intended to be limiting. For example, the cross-sectional views are by way of example only, and the present invention may also be practiced when the cross-sections include other materials/structures. In addition, the present invention has been described using the ICP (inductively coupled plasma) dry etch system(s) for etching the top electrode material 216 and the phase change material 214. However, the present invention may also be practiced with other types of dry etch systems such as a PE (plasma etching) type, a RIE (reactive ion etching) type, a MERIE (magnetic enhanced reactive ion etching) type, a CCP (capacitively coupled plasma) type, a DPS (decoupled plasma source) type, or a ECR (electron cyclotron resonance) type.

The present invention is limited only as defined in the following claims and equivalents thereof.

The invention claimed is:

1. A method of fabricating a semiconductor device, the method comprising:
    forming a phase change material;
    forming a first electrode material on the phase change material;
    patterning the first electrode material with an etch recipe including at least one of bromine and iodine and not including chlorine to form a first electrode; and
    pattering the phase change material with the etch recipe including at least one of bromine and iodine and not including chlorine to form a phase change structure,
    wherein the first electrode material and the phase change material are etched with the etch recipe including the steps of:
    flowing HBr gas into a reaction chamber at a flow rate in a range from 40 to 60 sccm (standard cubic centimeters per minute); and
    flowing Ar gas into the reaction chamber at a flow rate in a range from 40 to 60 sccm (standard cubic centimeters per minute).

2. The method of claim 1, wherein the etch recipe further includes the steps of:
    setting a pressure within the reaction chamber to be from 3 to 7 milli-Torr or from 20 to 40 milli-Torr;
    setting a bias power applied on a semiconductor substrate having the semiconductor device fabricated thereon to be from 150 to 250 Watts; and
    setting a source power for generating plasma to be from 400 to 600 Watts.

3. The method of claim 1, further comprising:
    forming a second electrode;
    wherein the phase change structure is disposed between the first and second electrodes.

4. The method of claim 3, wherein each of the first and second electrodes is comprised of a respective one of TiN, TiAlN, TiBN, TiSiN, TaN, TaAlN, TaBN, TaSiN, WN, WBN, WSiN, WAlN, ZrN, ZrSiN, ZrAlN, ZrBN, MoN, Al, Al—Cu, Al—Cu—Si, WSi$_x$, Ti, W, Mo, Ta, and TiW, and wherein the phase change material is one of Ge—Sb—Te, Ge—Bi—Te, As—Sb—Te, As—Ge—Sb—Te, Sn—Sb—Te, Sn—Sb—Te, In—Sn—Sb—Te, Ag—In—Sb—Te, GroupVA-Sb—Te, GroupVIA-Sb—Te, GroupVA-Sb—Se, GroupVIA-Sb—Se, Ge—Sb—Te—Si, As—Sb—Te—Si, As—Ge—Sb—Te—Si, Sn—Sb—Te—Si, In—Sn—Sb—Te—Si, Ag—In—Sb—Te—Si, GroupVA-Sb—Te—Si, GroupVIA-Sb—Te—Si, GroupVA-Sb—Se—Si, and GroupVIA-Sb—Se—Si.

5. A method of fabricating a semiconductor device, the method comprising:
    forming a phase change material;
    forming a first electrode material on the phase change material;
    patterning the first electrode material with a first etch recipe including at least one of bromine and iodine and not including chlorine to form a first electrode; and
    pattering the phase change material with a second etch recipe including at least one of bromine and iodine and not including chlorine to form a phase change structure,
    wherein the first electrode material is etched in a dry etch system with the first etch recipe including the steps of:
    flowing HBr gas into the dry etch system at a flow rate of from 40 to 60 sccm (standard cubic centimeters per minute);
    flowing Ar gas into the dry etch system at a flow rate of from 40 to 60 sccm (standard cubic centimeters per minute);
    setting a pressure within the dry etch system to be from 3 to 7 milli-Torr or from 20 to 40 milli-Torr;
    setting a bias power applied on a semiconductor substrate having the semiconductor device fabricated thereon to be from 150 to 250 Watts; and
    setting a source power for generating plasma to be from 400 to 600 Watts,
    and wherein the phase change material is etched in the dry etch system with the second etch recipe including the steps of:
    flowing HBr gas into the dry etch system at a flow rate of from 15 to 35 sccm (standard cubic centimeters per minute);
    flowing Ar gas into the dry etch system at a flow rate of from 40 to 60 sccm (standard cubic centimeters per minute);
    setting a pressure within the dry etch system to be from 5 to 20 milli-Torr;
    setting a bias power applied on the semiconductor substrate within the dry etch system to be from 150 to 250 Watts; and
    setting a source power for generating plasma within the dry etch system to be from 400 to 600 Watts.

* * * * *